United States Patent [19]
Dagens et al.

[11] Patent Number: 6,035,078
[45] Date of Patent: Mar. 7, 2000

[54] INTEGRATED INTERFEROMETER STRUCTURE

[75] Inventors: Béatrice Dagens, Paris; Christopher Janz, Issy-les-Mlx, both of France

[73] Assignee: Alcatel, Paris, France

[21] Appl. No.: 09/148,187

[22] Filed: Sep. 4, 1998

[51] Int. Cl.$^7$ .............................. G02B 6/12; H04J 14/00; G01B 9/02

[52] U.S. Cl. .................................. 385/14; 385/39; 385/40; 385/130; 385/140; 359/115; 359/124; 356/345

[58] Field of Search .................................. 385/1, 2, 8, 9, 385/14, 39, 40, 130, 131, 132, 140; 359/115, 124; 356/345

[56] References Cited

U.S. PATENT DOCUMENTS

| | | | |
|---|---|---|---|
| 4,978,188 | 12/1990 | Kawachi et al. | 385/14 X |
| 5,233,453 | 8/1993 | Sivarajan et al. | 359/117 |
| 5,287,376 | 2/1994 | Paoli | 372/43 |
| 5,703,975 | 12/1997 | Miller et al. | 385/16 |
| 5,802,222 | 9/1998 | Rasch et al. | 385/1 |
| 5,841,929 | 11/1998 | Komatsu et al. | 385/129 |

FOREIGN PATENT DOCUMENTS 0 717 482 A1   6/1996   European Pat. Off. ............. 385/14 X

OTHER PUBLICATIONS

M. Schilling et al., "Wavelength Converter Based on Integrated All–Active Three–Port Mach–Zehnder Interferometer", Electronics Letters, vol. 30, No. 25, Dec. 8, 1994, pp. 2128–2130.

S. L. Danielsen et al, Compensation of gain saturation in SOA gates by interferometric mach Zehnder wavelength converters, Proceedings of the ECOC 1996, $22^{nd}$ Conference on Optical Communication, vol. 4, Sep. 15, 1996, Oslo, pp. 45–48.

Patent Abstracts of Japan, vol. 017, No. 290 (P–1549) Jun. 3, 1993 corresponding to JP 05 019311A (Fujitsu Ltd) Jan. 29, 1993.

Patent Abstracts of Japan, vol. 018, No. 022 9E–1490) Jan. 13, 1994 corresponding to JP 05 259581 A (Nippon Telegraph & Telephone Corp) Oct. 8, 1993.

Primary Examiner—Brian Healy
Attorney, Agent, or Firm—Sughrue, Mion, Zinn, Macpeak & Seas, PLLC

[57] ABSTRACT

An integrated interferometer structure, in particular for optical signal wavelength converters, includes a first branch and a second branch including at least a first semiconductor optical amplifier coupled to input and/or output peripheral semiconductor optical amplifiers. The structure includes an attenuation section between the output of at least one amplifier of one branch and the input of the output peripheral amplifier and/or the length of the waveguide of at least one peripheral amplifier is less than 300 $\mu$m. Applications in telecommunications, in particular for routing signals.

5 Claims, 5 Drawing Sheets

○ t=100%
× t=60%
◇ t=40%

□ L1=L2=300 μm

◇ L1=450 μm
L2=150 μm

INTEGRATED INTERFEROMETER STRUCTURE

BACKGROUND OF THE INVENTION

1. Field of the Invention

The invention concerns opto-electronic systems used for optical transmission or for processing optical digital data.

It relates more particularly to interferometer structures for use in wavelength converters and add/drop multiplexers used in the telecommunications art. In particular, wavelength converters are used to convert a transmitted optical signal from one wavelength to another wavelength without degrading performance.

2. Description of the Prior Art

Wavelength conversion is used in particular in routing signals to solve contention problems.

In these devices the information is in the form of binary data represented by pulses modulating an optical carrier wave. A binary value is therefore determined by the amplitude (or power) level of the modulated optical wave.

During transmission the signal may be degraded which makes it more difficult to detect high and low levels of the received signal in the receivers.

In the amplitude domain the quality of an optical signal is usually defined by at least two parameters: the signal to noise ratio and the extinction ratio.

The signal to noise ratio is defined as the ratio of the optical power of the signal to the power of the noise in a band of wavelengths containing the wavelength of the signal carrier.

The extinction ratio is defined as the ratio of the powers respectively corresponding to the high and low levels of the signal. This ratio must be sufficiently high despite variations in the input signal.

FIG. 1 shows an interferometer structure in the case of a wavelength converter. It comprises two guide branches 1 and 2. At least one branch includes a semiconductor optical amplifier $OA_1$. For reasons of symmetry, it is usually preferred to place a second semiconductor optical amplifier $OA_2$ on the other branch 2. The presence of the second semiconductor optical amplifier $OA_2$ assures substantially the same Level of amplification in both branches of the structure and consequently substantially identical powers at the output of the interferometer branches.

The two optical amplifiers $OA_1$, $OA_2$ are sufficient in themselves to form the interferometer structure when the latter is of the "active-passive" type, i.e. when the guides constituting it are made from two types of material to form active guides and passive guides. In this case the guides at the ends of the interferometer structure form passive guides and are made from a non-absorbing material so that the optical signal at the output from the interferometer structure is identical to the signal from the amplifiers $OA_1$ and $OA_2$. However, producing an "active-passive" type integrated structure of the above kind is very complicated because it requires a plurality of successive epitaxial growth steps to deposit the two types of material. Because the fabrication of this structure is slow and difficult, its cost is considerably increased.

To simplify fabrication and to reduce the cost of an integrated interferometer structure of the above kind it is preferable to use an "all active" structure, i.e. a structure in which the guides are all active and are formed of a single material. However, in this case the optical signal from the amplifiers $OA_1$ and $OA_2$ is strongly absorbed by the material used and the optical power at the output of the structure becomes much too low to be detected. Consequently, in an "all active" structure it is necessary to add peripheral optical amplifiers to amplify the optical power absorbed and to recover a usable signal at the output of the structure. These peripheral amplifiers are the amplifiers $OA_3$, $OA_4$, $OA_5$ and $OA_6$ in FIG. 1.

The components of the "all active" interferometer structure shown in FIG. 1 are described in detail below.

A first coupler $K_1$ couples one end of each of these branches to a peripheral semiconductor optical amplifier (input amplifier) $OA_5$. A laser 7 supplies to the peripheral amplifier $OA_5$ an output carrier wave M at wavelength $\lambda_o$.

A second coupler $K_2$ couples the other end of the first branch 1 to another input peripheral semiconductor optical amplifier $OA_4$. The coupler $K_2$ introduces into the first amplifier $OA_1$ an input signal I at wavelength $\lambda_i$ that has been amplified by the input amplifier $OA_4$. The amplifier $OA_1$ saturates and the state of the interferometer is changed, which phase modulates the output carrier wave.

A third coupler $K_3$ connected to the coupler $K_2$, to the second amplifier $OA_2$ and to another peripheral semiconductor optical amplifier (output amplifier) $OA_3$ supplies an output signal O resulting from the coupling of auxiliary waves $AM_1$ and $AM_2$ respectively supplied by the first and second amplifiers $OA_1$ and $OA_2$. The waves $AM_1$ and $AM_2$ correspond to the waves $M_1$ and $M_2$ from the coupler $K_1$ and respectively amplified by the amplifiers $OA_1$ and $OA_2$. The output signal O at wavelength $\lambda_o$ is then amplified by the output peripheral amplifier $OA_3$.

Another peripheral amplifier $OA_6$ is included to preserve the symmetry of the structure and to replace one of the amplifiers $OA_3$ or $OA_4$ in the event of a fault.

Respective currents I1 and I2 are injected into the amplifiers $OA_1$ and $OA_2$ via electrodes E1 and E2. The output signal O is the result of constructive or destructive interference between the waves $AM_1$ and $AM_2$, depending on the phase difference between the two branches of the interferometer.

To assure efficient wavelength conversion the saturation power threshold of the amplifiers $OA_1$ and $OA_2$ in branches 1 and 2 of an interferometer structure of the above kind is set relatively low. Consequently, when interference of the waves $AM_1$ and $AM_2$ is constructive, i.e. when the waves $AM_1$, and $AM_2$ are in phase, the optical powers of the two amplifiers $OA_1$ and $OA_2$ add with the result that the optical power in the output amplifier $OA_3$ is very high.

In this case the output amplifier $OA_3$ is strongly saturated and the extinction ratio is therefore highly degraded. The gain at high levels becomes lower than the gain at low levels with the result that the output signal O is subject to compression of the high levels and is consequently distorted. This distortion can also occur in the input signal I or in the output carrier wave M. If the input signal I is distorted or if the output carrier wave M is distorted the output signal O is degraded and the extinction ratio of the interferometer structure is reduced.

It is therefore apparent that it is desirable for the peripheral amplifiers to be able to operate under non-saturated conditions.

The input saturation power of an amplifier is generally defined by the input optical power at which the gain of the amplifier is halved.

The drawbacks mentioned above can occur in any "all active" interferometer structure. The aim of the invention is to remedy these drawbacks by proposing a structure which, compared to prior art structures, renders it more difficult for the input power of the peripheral amplifiers to reach the input saturation power. This can be achieved either by increasing the input saturation power of said amplifiers or by reducing the input power of the amplifiers.

SUMMARY OF THE INVENTION

The invention consists in an integrated interferometer structure for supplying an output optical signal wherein a first branch and a second branch including at least a first semiconductor optical amplifier are coupled to input and/or output peripheral semiconductor optical amplifiers and said structure includes an attenuation section between the output of at least one amplifier of one branch and the input of the output peripheral amplifier and/or the length of the waveguide of at least one peripheral amplifier is less than 300 μm.

In accordance with another feature of the invention the attenuation section introduces at least 50% optical losses.

Other features and advantages of the invention will become apparent from a reading of the following description given by way of illustrative and non-limiting example with reference to the accompanying drawings and for the particular case of a wavelength converter.

DETAILED DESCRIPTION OF THE PREFERRED EMBODIMENTS

Throughout the remainder of the description the same reference numbers are used to designate the same components.

For efficient wavelength conversion the semiconductor optical amplifiers $OA_1$ and $OA_2$ on the branches of Mach-Zehnder or equivalent interferometers must have a relatively low saturation threshold.

On the other hand, for the extinction ratio to be optimum at the output of the interferometer and to prevent distortion of the input signal I and the output carrier wave M, the peripheral amplifiers $OA_3$, $OA_4$ and $OA_5$ must operate with the lowest possible saturation. To achieve this the structure must be such that it is more difficult for the input power to reach the input saturation threshold.

To obtain a structure of the above kind it is possible either to reduce the optical power injected into the amplifier or to increase its saturation threshold.

To prevent the extinction ratio at the interferometer output from being degraded, the operating conditions of at least one peripheral amplifier are modified. These operating conditions include the optical power at the amplifier input or its input saturation power. Priority is preferably given to modifying the operating conditions of the output amplifier. The operating conditions of the other peripheral amplifiers $OA_4$ and $OA_5$ can then be modified to avoid distortion of the input signal I and the output carrier wave M.

In a first embodiment of a wavelength converter of the invention the optical power injected into the output peripheral amplifier $OA_3$ is reduced. This first embodiment is schematically represented in FIG. 2 which shows a wavelength converter including a Mach-Zehnder interferometer structure.

Figure 1:
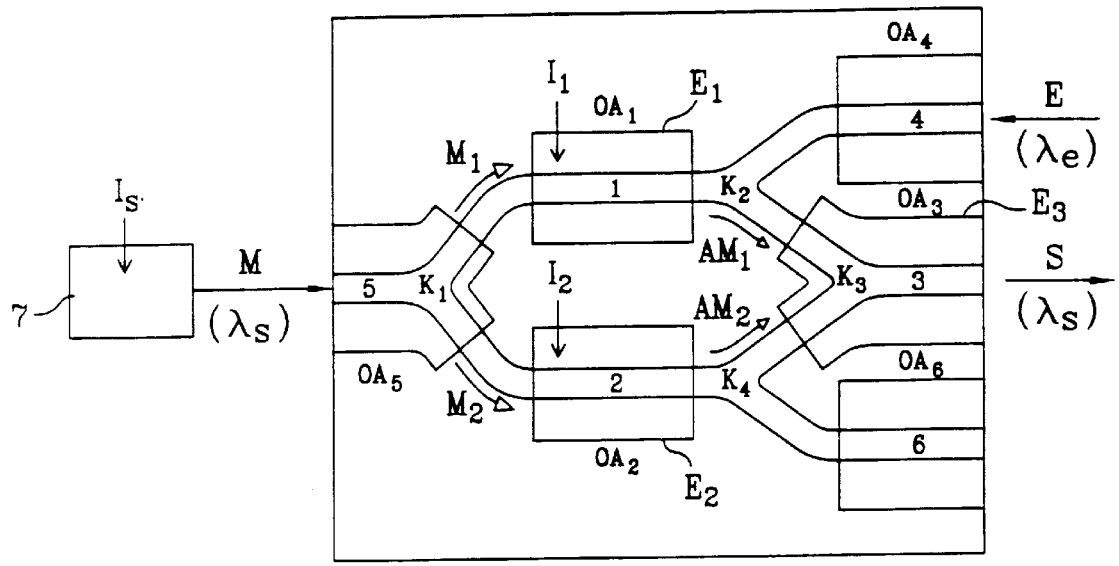
FIG. 1, already described, is a schematic representation of a prior art Mach-Zehnder interferometer structure with peripheral semiconductor optical amplifiers.
Figure 2:
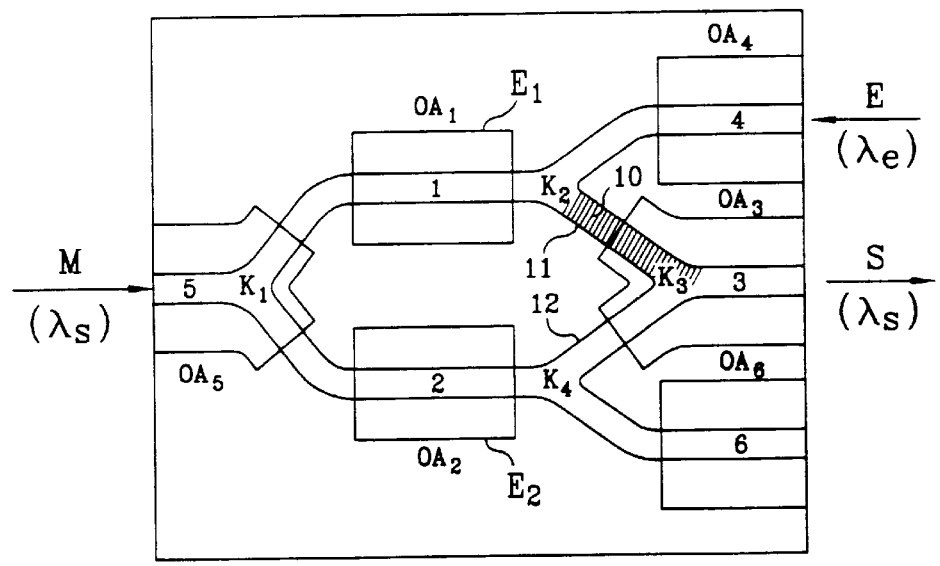
FIG. 2 is a schematic representation of the first embodiment of a wavelength converter.

The converter advantageously includes an attenuation section 10 which is shown shaded in FIG. 2 between the output of the optical amplifier $OA_1$ of the first branch 1 and the input of the output peripheral amplifier $OA_3$.

The position of the input of the output amplifier $OA_3$ is generally defined as being located just downstream of the coupler $K_3$ and not at the limit of the electrode $E_3$.

The attenuation section 10 is obtained by introducing optical losses into the corresponding arm 11 of the waveguide.

To achieve this the arm 11 of the waveguide can be interrupted, for example, to diffract some of the light. In this case the guide has two facing tapered sections, for example, enabling some of the luminous power to be diffracted and another part to be re-injected. This is the simplest implementation because only the shape of the mask used to etch the waveguide changes.

Another method of introducing such losses consists in curving the arm 11 of the guide relative to the end of the amplifier $OA_1$ with a steeper slope, for example.

Losses can also be introduced exclusively at the level of the coupler $K_3$ by using a coupler that is not well matched to the interferometer structure, for example.

Of course, the above methods are merely examples. Any method known to introduce optical losses into the section 10 of a converter can be used.

In one embodiment the attenuation section can be between the output of the two amplifiers $OA_1$, $OA_2$ and the input of the output amplifier $OA_3$, along arms 11 and 12 of the waveguide.

Figure 3A:
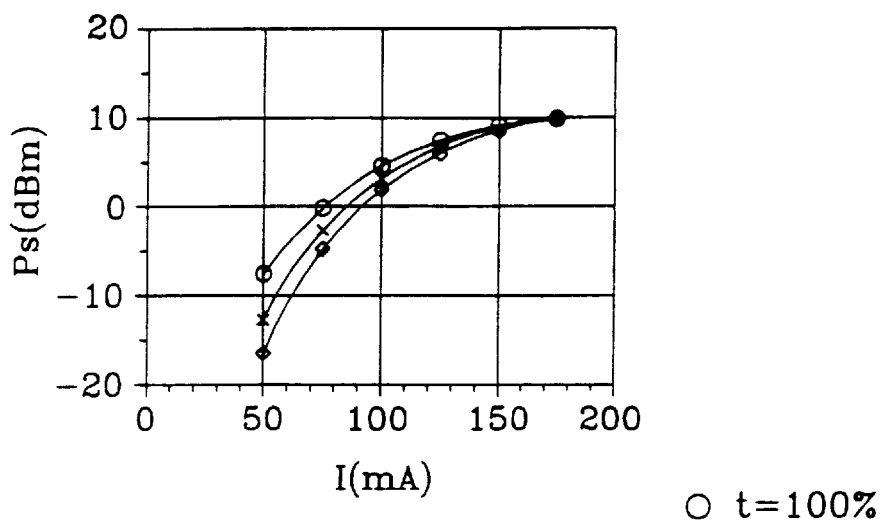
FIGS. 3A through 3C are curves respectively showing the variation in the output power (Po), the extinction ratio (ER) and the signal to noise ratio (S/N) as a function of the current (I) injected and the optical transmission ratio in a peripheral amplifier.
Figure 3B:
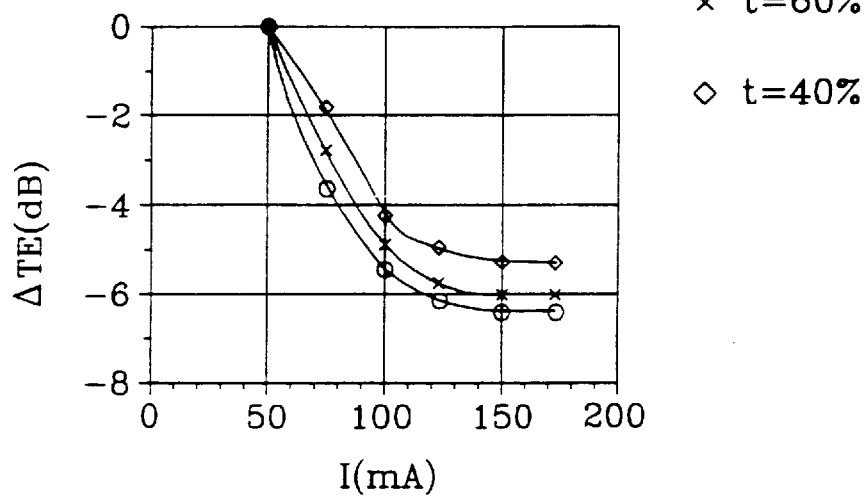
Figure 3C:
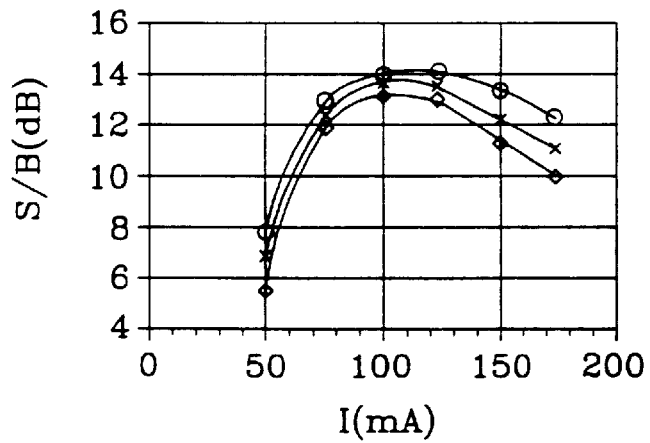

The curves of FIGS. 3A through 3C compare the results obtained with a wavelength converter having an attenuation section between the amplifiers $OA_1$ and $OA_2$ and the amplifier $OA_3$ with, respectively:

no optical loss (total optical power in amplifier $OA_3$ Pt=200%=sum of output powers of amplifiers $OA_1$, and $OA_2$ and optical transmission ratio of each arm 11 and 12 t=100%), 80% optical losses (total optical power Pt=120% and transmission ratio of each arm 11 and 12 t=60%), and 120% optical losses (total optical power Pt=80% and transmission ratio of each arm 11 and 12 t=40%).

The aim is to obtain a constant converter output power level Po without degrading the extinction ratio ER or the signal to noise ratio S/N.

The curves indicate that for the same output power Po the extinction ratio ER increases as transmission decreases, i.e.

as the attenuation coefficient in arms 11 and 12 increases. The signal to noise ratio S/N remains substantially the same.

Consequently, it is preferable to attenuate strongly the optical power at the output of the amplifiers $OA_1$ and/or $OA_2$ to maintain an optimum extinction ratio at the output of the converter and to avoid distortion of the signal. Accordingly, the structure of the attenuation section is such that it enables introduction of at least 50% optical losses.

The attenuation section 10 in the arms 11 and 12 between the output of the amplifiers $OA_1$ and $OA_2$, respectively, and the input of the output amplifier $OA_3$ preferably introduces at least 50% optical losses in each arm 11 and 12 in order to halve the total optical power in the coupler $K_3$, i.e. the power injected into the output amplifier $OA_3$.

In a second embodiment of a wavelength converter of the invention the saturation threshold of at least one peripheral amplifier is increased. To achieve this the structure of the active waveguide of this peripheral amplifier is modified.

Priority is preferably given to modifying the structure of the waveguide of the output amplifier $OA_3$ to maintain the correct extinction ratio of the output signal O and thereby to avoid distortion of that signal. The structure of the other input peripheral amplifiers $OA_4$ and then $OA_5$ can then be modified to prevent any distortion of the input signal I and the output carrier wave M.

Figure 4:
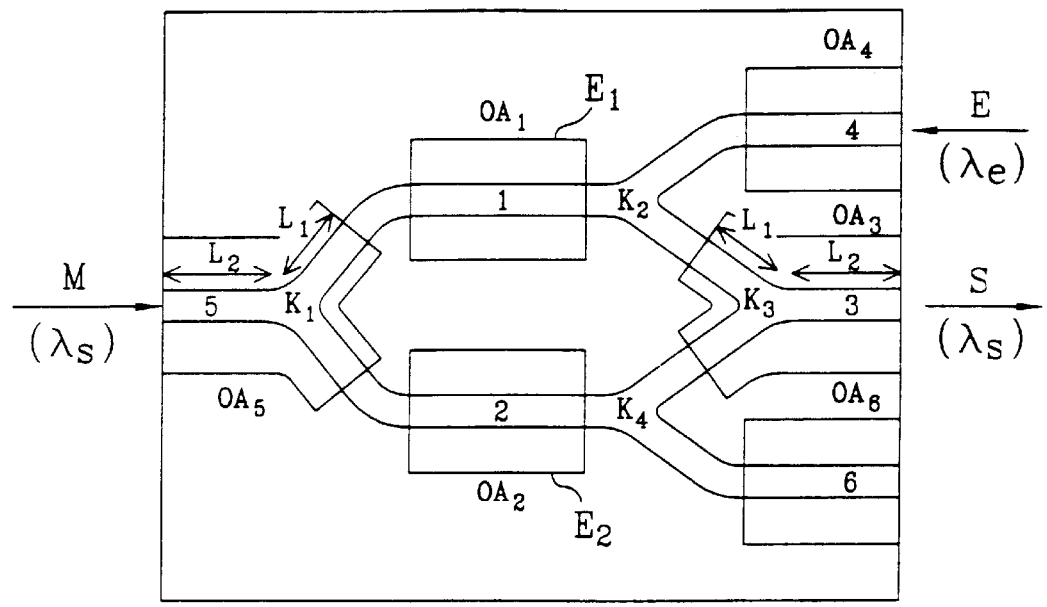
FIG. 4 is a schematic representation of another embodiment of a wavelength converter.

The second embodiment is shown in FIG. 4 which represents a wavelength converter including a Mach-Zehnder interferometer structure in which the length of the active waveguides of the output peripheral amplifiers $OA_3$ and the input peripheral amplifiers $OA_4$ and $OA_5$ is less than a particular limiting value.

The input saturation of a semiconductor optical amplifier varies inversely to the length of the active waveguide of that amplifier. Consequently, to increase the saturation power of the peripheral amplifiers, and in particular that of the output amplifier $OA_3$, the length of their active waveguide is restricted.

The extinction ratio is essentially degraded in the output amplifier $OA_3$, downstream of the coupler $K_3$, but also at the output of the input amplifiers $OA_4$ and $OA_5$, upstream of the couplers $K_2$ and $K_1$. The degree to which the extinction ratio is degraded increases with the length of the active waveguide of the amplifiers because the associated saturation power decreases.

The length of the active waveguide of a peripheral amplifier is defined as the length L2 of the waveguide portion at the ends of the converter, i.e. between a coupler $K_3$ or $K_1$ and the output or the input of the interferometer structure.

The length L1 of the first active waveguide portion of the output amplifier $OA_3$, which is upstream of the Y junction, i.e. upstream of the coupler $K_3$, is less important. In this waveguide portion the converted signal $AM_1$ has not yet interfered with the signal $AM_2$ supplied by the second amplifier $OA_2$ of the interferometer and is still phase modulated: saturation of the output amplifier $OA_3$ therefore does not modify the extinction ratio of the signal in this waveguide portion. Consequently, the length L1 of the waveguide portion preceding the coupler $K_3$ is not restructured.

On the other hand, if the length actually used, i.e. the length L2 of the second portion of the active waveguide downstream of the coupler $K_3$, is greater than a particular limiting value then the saturation power of the output amplifier $OA_3$ becomes too low for the interferometer to be able to operate at a suitable output power Po and with a signal to noise ratio S/N and an extinction ratio ER that are not degraded. This limiting value of the length L2 of the peripheral amplifier waveguide is equal to 300 82 m.

Figure 5A:
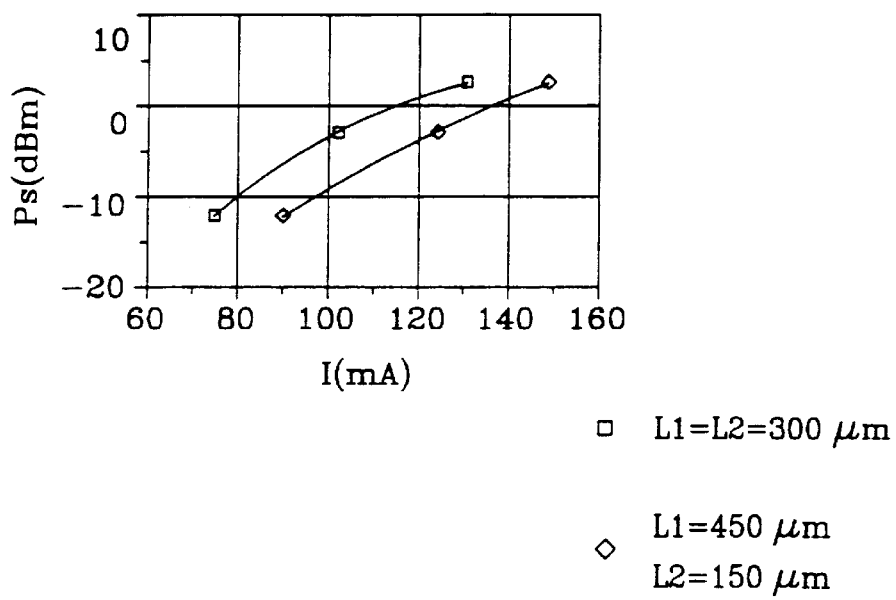
FIGS. 5A through 5C are curves respectively showing the variation in the output power (Po), the extinction ratio (ER) and the signal to noise ratio (S/N) as a function of the current (I) injected and the waveguide length in a peripheral amplifier.
Figure 5B:
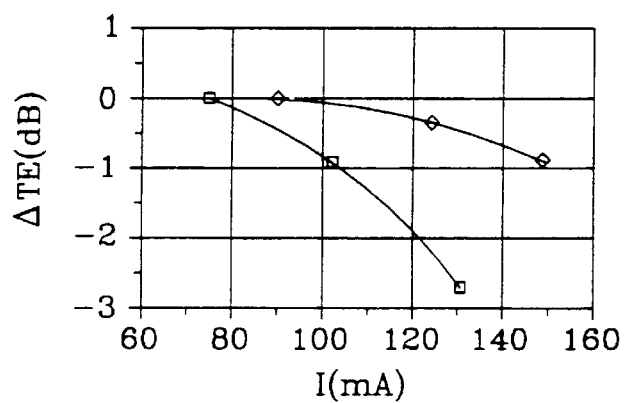
Figure 5C:
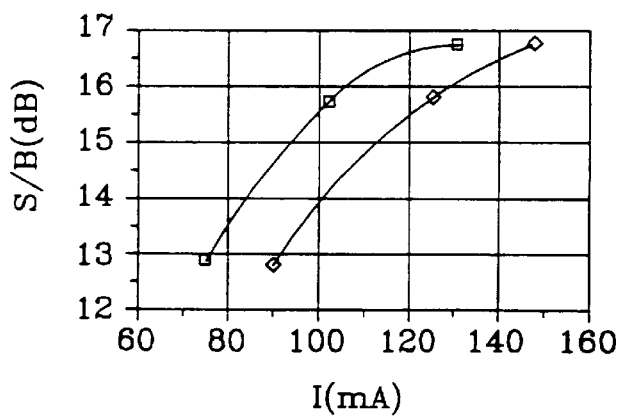

The curves of FIGS. 5A through 5C compare the results obtained with a peripheral amplifier, for example the output amplifier $OA_3$, in which the length L2 of the active layer strip is respectively equal to and less than 300 $\mu$m.

However, in both cases, the global length L of the amplifier compared remains the same. In both cases the sum of the length L2 of the waveguide portion downstream of the coupler $K_3$ and the length L1 of the waveguide portion upstream of this coupler is identical and in the example illustrated by FIGS. 5A through 5C is equal to 600 $\mu$m.

The curves indicate that for the same output power Po and for an equivalent signal to noise ratio S/N the extinction ratio is degraded to a much smaller degree when the waveguide length is less than 300 $\mu$m.

Accordingly, for an output power greater than −5 dBm the extinction ratio ER is degraded by more than 1 dB, or even 2 dB when the length of the amplifier is 300 $\mu$m, whereas it remains below 1 dB if the length of the amplifier is equal to 150 $\mu$m.

Consequently, the length of the active waveguide of at least one peripheral amplifier is preferably less than 300 $\mu$m to increase the saturation threshold of that amplifier and to preserve an optimum extinction ratio combined with a suitable output power Po.

However, the active waveguide must be sufficiently long to enable filtering of high order optical modes and high quality operation of the interferometer and sufficiently short to prevent signal saturation effects. Consequently, this length is preferably in the range 100 $\mu$m to 300 $\mu$m.

The embodiments that have just been described are very simple to implement because they do not require any additional technology step during the fabrication of the optical components. In the simplest implementation only the shape of the mask used to etch the active waveguide changes.

Figure 6:
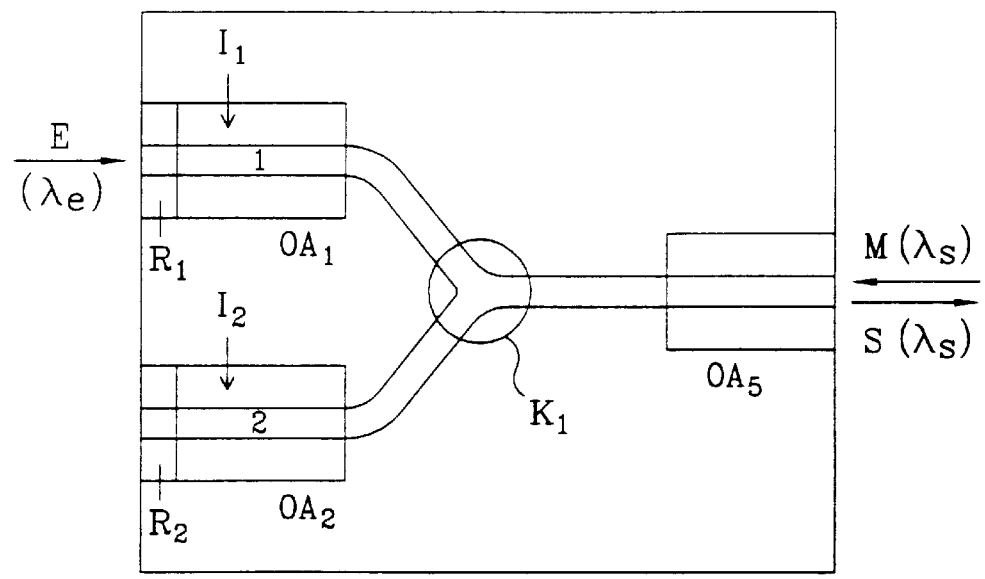
FIG. 6 is a schematic representation of a Michelson structure to which the invention applies.

FIG. 6 shows another Michelson structure equivalent to the preceding structure to which the invention applies. In this embodiment the two amplifiers $OA_1$ and $OA_2$ are coupled at only one end, the opposite faces being provided with a reflecting coating R1, R2. The modulating input signal I is injected into the first amplifier $OA_1$ via the face R1 and the output carrier wave M is injected into both amplifiers $OA_1$ and $OA_2$ via the faces opposite the faces R1 and R2 using a coupler K1 coupling one end of each of the branches 1 and 2 to a peripheral semiconductor amplifier $OA_5$. An output signal O at wavelength $\lambda_e$ resulting from the coupling of auxiliary waves applied by the first and second amplifiers $OA_1$ and $OA_2$ is then amplified by the peripheral amplifier $OA_5$.

Figure 7:
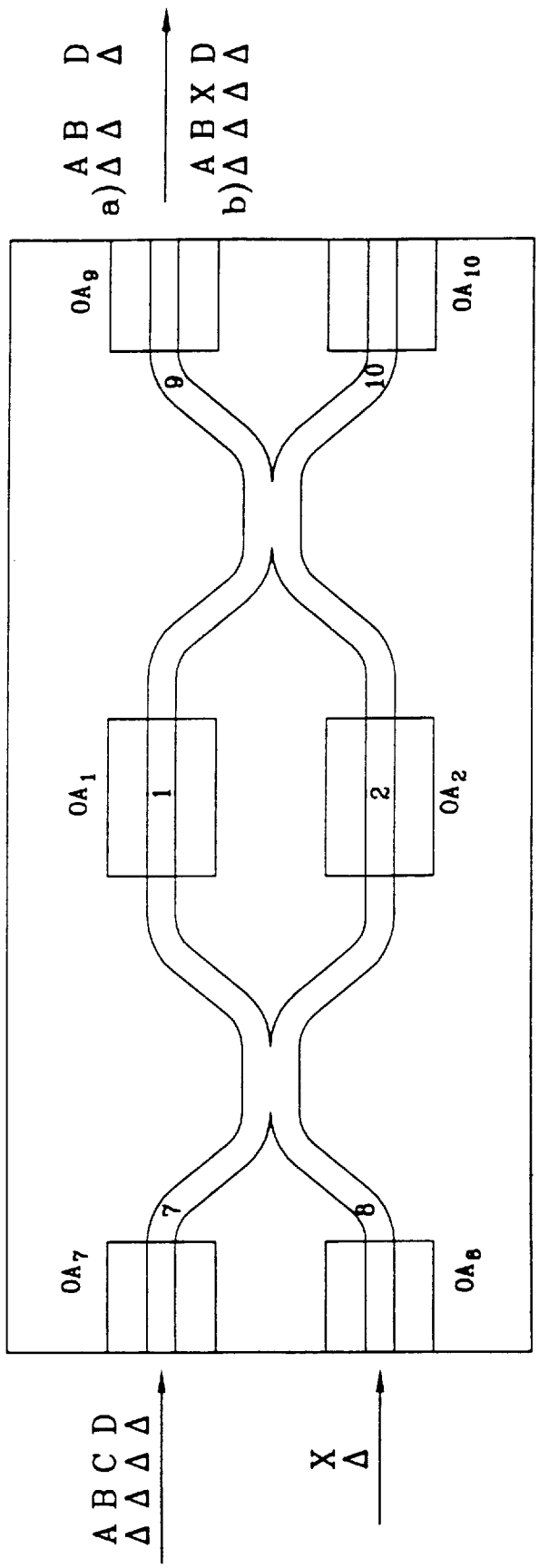
FIG. 7 is a schematic representation of an add/drop interferometer multiplexer structure.

FIG. 7 shows another type of interferometer structure to which the invention applies. This type of structure concerns add/drop interferometer multiplexers. The structure shown in FIG. 7 corresponds to an "all active" device and has peripheral amplifiers $OA_7$, $OA_8$, $OA_9$, $OA_{10}$ at its extremities. A four-channel multiplexed signal ABCD is injected into amplifier $OA_7$, for example. This signal is split in two in branches 1 and 2 of the interferometer and then recombined and recovered at the output of amplifier $OA_9$. One signal channel, for example channel C, can be eliminated by sending a control pulse via amplifier $OA_9$ to phase-shift the pulses of the channel C in question. The signal recovered at the output of amplifier $OA_9$ then corresponds to the situation a) in FIG. 7 and comprises only three channels ABD. In a similar way another channel X can then be added by amplifier $OA_8$. In this situation, that denoted b) in FIG. 7, a multiplexed signal comprising four channels ABXD is recovered at the output of amplifier $OA_9$.

There is claimed:

1. An integrated interferometer structure for supplying an output optical signal wherein a first branch and a second branch including at least a first semiconductor optical amplifier are coupled to input and/or output peripheral semiconductor optical amplifiers and said structure includes an attenuation section between the output of at least one amplifier of one branch and the input of the output peripheral amplifier and/or the length of the waveguide of at least one peripheral amplifier is less than 300 μm.

2. The interferometer structure claimed in claim 1 wherein said attenuation section introduces at least 50% optical losses.

3. The interferometer structure claimed in claim 1 wherein the length of said waveguide is in the range 100 μm to 300 μm.

4. A wavelength converter including an integrated interferometer structure as claimed in claim 1.

5. An add/drop multiplexer including an integrated interferometer structure as claimed in claim 1.

* * * * *